United States Patent
Morse

(10) Patent No.: US 7,180,148 B2
(45) Date of Patent: Feb. 20, 2007

(54) OPTICAL SYSTEM WITH A HIGH GERMANIUM CONCENTRATION SILICON GERMANIUM ALLOY INCLUDING A GRADED BUFFER LAYER

(75) Inventor: Mike Morse, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/035,921

(22) Filed: Jan. 12, 2005

(65) Prior Publication Data

US 2005/0136566 A1    Jun. 23, 2005

Related U.S. Application Data

(62) Division of application No. 10/611,042, filed on Jun. 30, 2003, now Pat. No. 7,122,392.

(51) Int. Cl.
*H01L 31/0232* (2006.01)
*H01L 31/075* (2006.01)
*H01L 31/105* (2006.01)
*H01L 31/117* (2006.01)

(52) U.S. Cl. .................................. 257/432; 257/458
(58) Field of Classification Search ............... 257/432, 257/458
See application file for complete search history.

(56) References Cited

U.S. PATENT DOCUMENTS

| 5,525,828 | A | 6/1996 | Bassous et al. |
| 5,659,187 | A | 8/1997 | Legoues et al. |
| 6,784,466 | B2 | 8/2004 | Chu et al. |
| 2003/0203531 | A1 | 10/2003 | Shchukin et al. |
| 2004/0121507 | A1 | 6/2004 | Bude et al. |

OTHER PUBLICATIONS

Zytkiewicz: Laterally Overgrown Structures as Substrates for Lattice Mismatched Epitaxy; Thin Solid Films 412 (2002); pp. 64-75.

*Primary Examiner*—William M. Brewster
(74) *Attorney, Agent, or Firm*—Kathy J. Ortiz

(57) ABSTRACT

A method of forming a high germanium concentration, low defect density silicon germanium film and its associated structures is described, comprising forming a dielectric layer on a substrate, patterning the dielectric layer to form a silicon region and at least one dielectric region, and forming a low defect silicon germanium layer on at least one dielectric region.

6 Claims, 11 Drawing Sheets

OPTICAL SYSTEM WITH A HIGH GERMANIUM CONCENTRATION SILICON GERMANIUM ALLOY INCLUDING A GRADED BUFFER LAYER

This U.S. patent application is a divisional of U.S. patent application Ser. No. 10/611,042 filed Jun. 30, 2003 now U.S. Pat No. 7,122,392.

FIELD OF THE INVENTION

The present invention relates to the field of semiconductor processing, and more particularly to methods of processing germanium layers for use in microelectronic photo detectors and structures formed thereby.

BACKGROUND OF THE INVENTION

High speed infrared photodetectors are becoming increasingly important for optical communication signal processing, infrared imaging and measurement systems. Photodetectors can be used for the detection of optical communication signals, such as those used in the telecommunication industry. A standard wavelength used in the telecommunication industry is 1.3 microns. Pure silicon photodetectors are limited in that they can only detect wavelengths up to about 1 micron. The addition of germanium to a silicon film used to fabricate a photodetector can increase the wavelength that can be detected (i.e., photodetector responsivity). For example, using a silicon-germanium film which incorporates more than 50 percent germanium can increase the photodetector responsivity to 1.3 microns or more. However, adding germanium to the silicon film often results in a strain to the silicon crystal lattice that may causes defects, such as threading dislocations, to be formed in the silicon-germanium film. The proliferation of such defects can result in an increase in the defect concentration, or defect density, in the silicon germanium film, which can impair the performance of a silicon germanium photodetector device.

Accordingly, there is a need for improved methods of forming a silicon germanium film and structures formed thereby which incorporate greater than 50 percent germanium concentration while exhibiting low defect concentrations. The present invention provides such methods and structures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
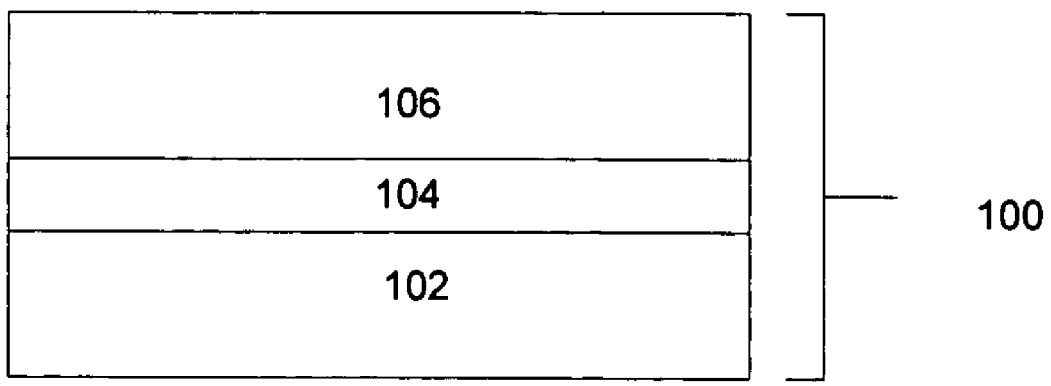
FIGS. 1a–1d represent cross-sections of structures that may be formed when carrying out an embodiment of the method of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a high germanium concentration, low defect density silicon germanium film and its associated structures are described. The methods and associated structures of the present invention confine the defect density of the silicon germanium film in a non-active device area, while providing for a low defect density silicon germanium film in an active area of the device. The formation of a such a low defect silicon germanium film comprises forming a dielectric layer on a substrate, patterning the dielectric layer to form a silicon region and at least one dielectric region, and forming a silicon germanium layer on at least one dielectric region and on the silicon region, wherein the silicon germanium layer formed on the dielectric region has a low defect concentration i.e., less than about $10^6$ defects per $cm^2$. The high germanium concentration, low defect density layer may then be used to form a microelectronic device, such as a photodetector, and thus enables the use of a silicon germanium based microelectronic photodetector which operates at a wavelength of at least 1.3 microns.

In one embodiment of the method of the present invention, as illustrated by FIGS. 1a–1d, a substrate 100 may be a silicon on insulator (SOI) substrate. A SOI substrate typically comprises an insulator layer sandwiched between two silicon layers. As shown in FIG. 1a, the substrate 100 comprises a first silicon layer 102, an insulator layer 104 disposed on the first silicon layer 102, and a second silicon layer 106 disposed on the insulator layer 104. The insulator layer 104 may be an oxide, such as silicon dioxide.

Figure 1B:
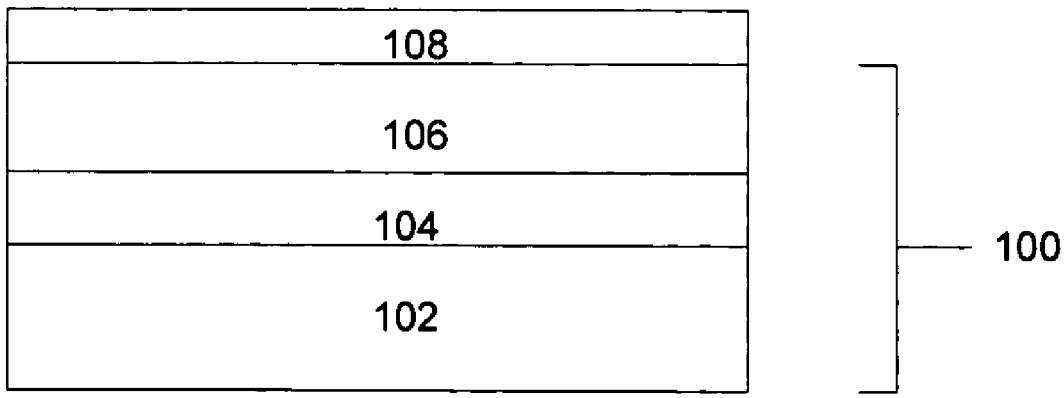
Figure 1C:
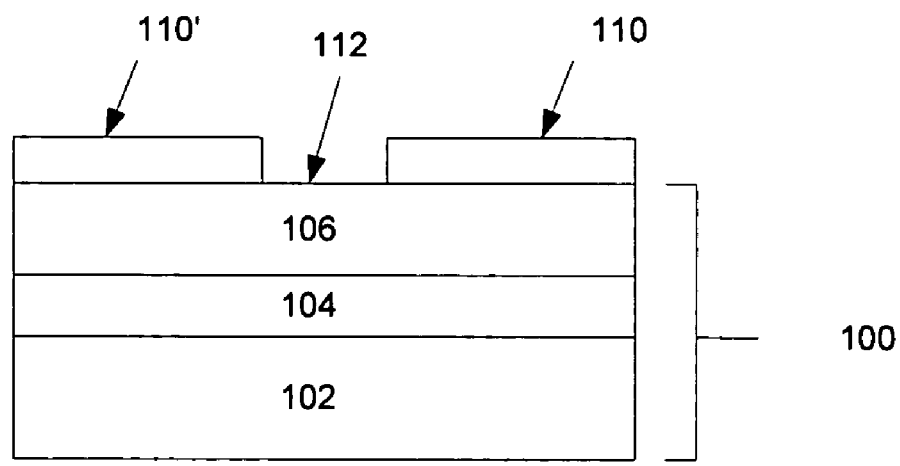
Figure 1D:
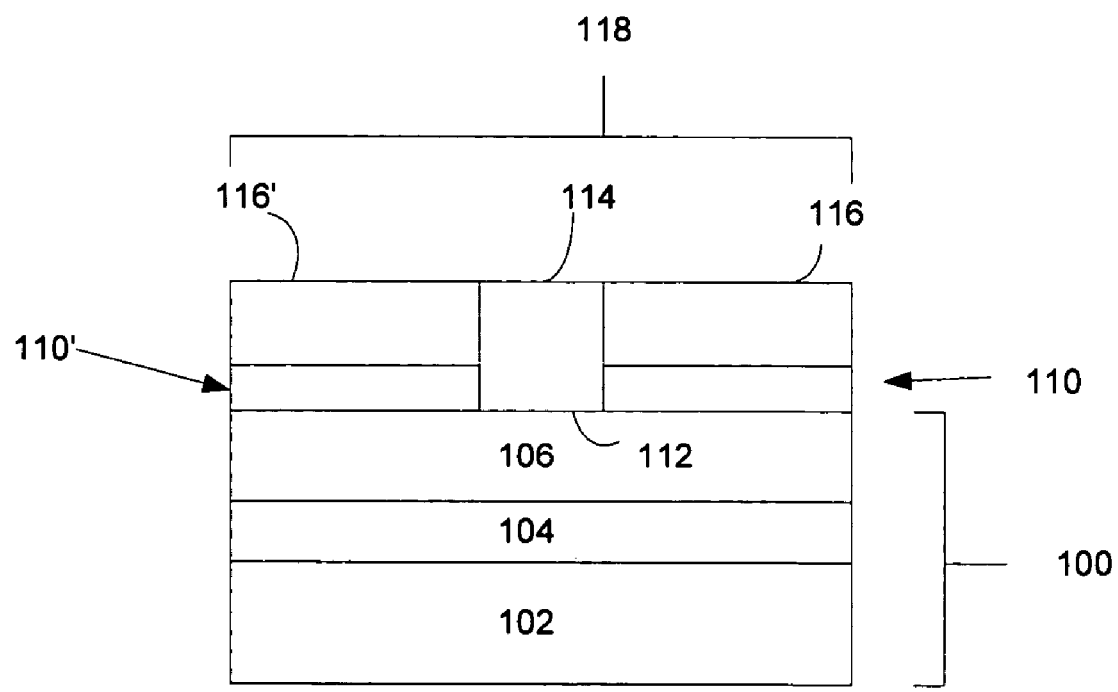

A dielectric layer 108 may be formed on the second silicon layer 106 of the substrate 100 (FIG. 1b). Those skilled in the art will appreciate that the dielectric layer 108 may be formed using conventional techniques, such as plasma enhanced chemical vapor deposition (PECVD) or thermal oxidation techniques. The dielectric layer 108 may then be patterned to form a silicon region 112 (by exposing the underlying second silicon layer 106), and at least one dielectric region (shown in FIG. 1c as a first dielectric region 110 and a second dielectric region 110'). The dielectric layer 108 may be patterned using standard lithographic techniques well known in the art, which typically comprise applying a photoresist on the dielectric layer 108, exposing the photoresist in areas to be added (light mask) or removed (dark mask) and then performing the appropriate etch.

A silicon germanium alloy layer may then be selectively formed over the silicon region 112 and the dielectric region 110, 110'. Both a high defect silicon germanium layer 114 and at least one low defect silicon germanium layer (shown in FIG. 1d as a first low defect silicon germanium layer 116 and a second low defect silicon germanium layer 116') may form during a single formation process step, to form a composite silicon germanium layer 118 which comprises the high defect silicon germanium layer 114 and the low defect silicon germanium layer 116, 116'. The high defect silicon germanium layer 114 that forms over the silicon region 112 comprises a defect density in the range of at least $10^6$ defects per centimeter squared. These defects may be in the form of threading dislocations that are formed to relieve the strain in the film lattice (due to a mismatch between the germanium and the silicon lattices) as it is being formed. The defects formed during the formation of the composite silicon germanium layer 118 are substantially confined to the high defect silicon germanium layer 114.

The composite silicon germanium layer 118 may be formed by selective epitaxy. In selective epitaxy, germanium is added to the silicon to form a silicon germanium alloy, such as the composite silicon germanium layer 118. The composite silicon germanium layer 118 thus formed may comprise at least 50 percent germanium, and preferably comprises greater than 50 percent germanium, and may further comprise 100 percent germanium. The composite silicon germanium layer 118 may be formed by utilizing conventional methods, suitable for the deposition of silicon germanium films comprising greater than 50 percent germanium, such as by utilizing a chemical vapor deposition (CVD) or an epitaxial process, as are well known in the art. The deposition process may include such process gases as $SiH_2Cl_2$ and $GeH_4$, or other suitable process gases. The process temperature may be in a range from about 600 to 750 degrees Celsius, but may vary depending on the process equipment and the particular application. It will be understood by those skilled in the art that while a few examples of the process parameters may be included herein, the composite silicon germanium layer 118 may be formed by other methods or processes that form a silicon germanium alloy comprising greater than 50 percent germanium.

The low defect silicon germanium layer 116, 116' that forms over the dielectric region 110, 110' may comprise a defect density below $10^6$ defects per centimeter squared, and may preferably be virtually defect free, because the defects in the composite silicon germanium layer 118 are substantially confined to the high defect silicon germanium layer 114. Selective epitaxy in the method of the present invention may also be called epitaxial lateral overgrowth (ELO) because the low defect silicon germanium layer 116, 116' forms laterally over at least one dielectric region (shown in FIG. 1d as forming laterally over the first dielectric region 110 and the second dielectric region 110'). Thus, the method of the present invention provides a high germanium concentration, low defect silicon germanium layer 116, 116'.

Figure 2A:
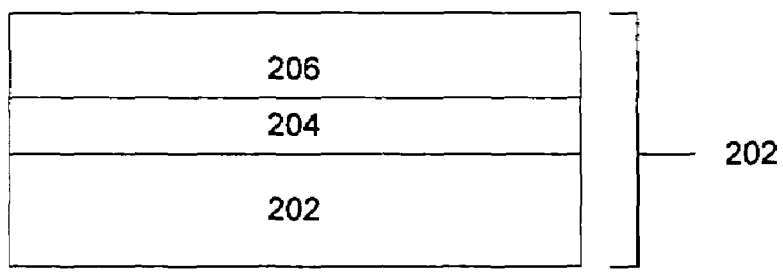
FIGS. 2a–2e represent cross-sections of structures that may be formed when carrying out another embodiment of the method of the present invention.

In another embodiment of the present invention (FIGS. 2a–2e), a substrate 200, which may be a SOI substrate (similar to the SOI substrate 100 in FIG. 1a), comprises first silicon layer 202, an insulator layer 204 disposed on the first silicon layer 202, and a second silicon layer 206 disposed on the insulator layer 204 (FIG. 2a). The insulator layer 204 may be an oxide, such as silicon dioxide.

Figure 2B:
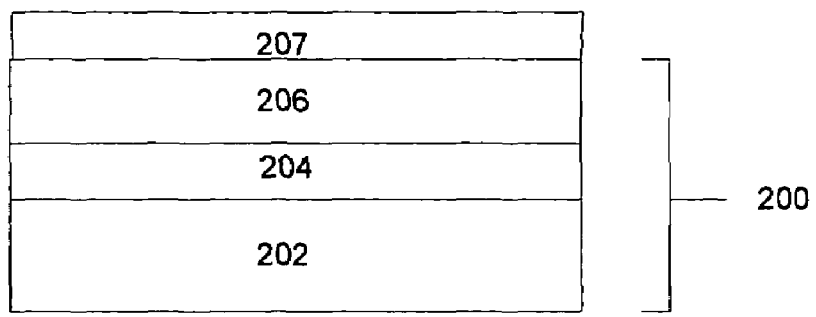

A buffer layer 207 may be formed on the second silicon layer 206 of the substrate 200 (FIG. 2b). The buffer layer 207 may comprise silicon germanium, and may be formed by CVD epitaxy, or by any such methods used to form a silicon germanium alloy, such as the composite silicon germanium layer 118 as previously discussed herein. The buffer layer 207 may be formed by using a grading technique, as is well known in the art, in which the buffer layer 207 is formed by sequentially increasing the percentage of germanium in the buffer layer 207 as the buffer layer 207 forms. The thickness of the buffer layer 207 is preferably less than 1 micron thick. The buffer layer 207 may also be formed by forming a thin layer of non-graded silicon germanium (preferably less than 1 micron in thickness), on the second silicon layer 206. The buffer layer 207 may then be cycled through an annealing process, as is known in the art. Defect concentrations of about $5 \times 10^6$ defects per centimeter squared may be obtained by using such a technique to form the buffer layer 207.

Figure 2C:
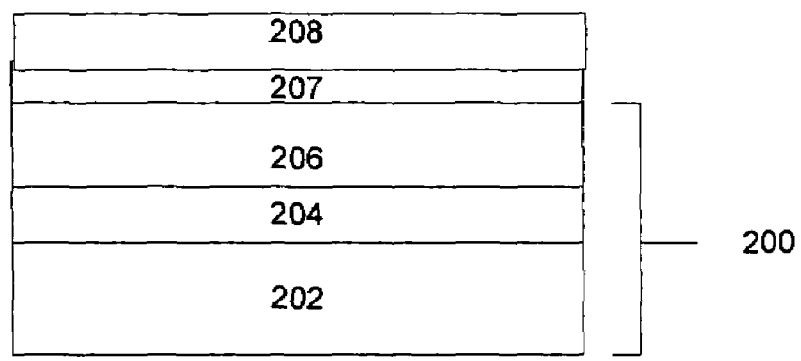
Figure 2D:
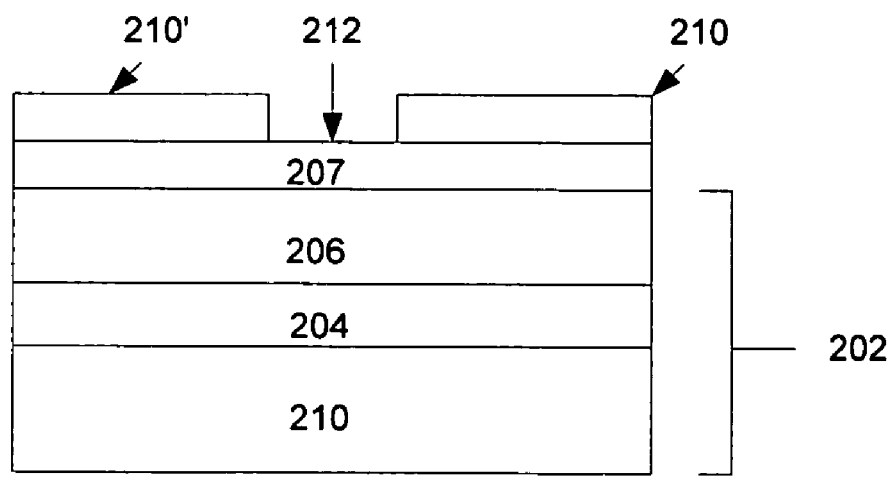
Figure 2E:
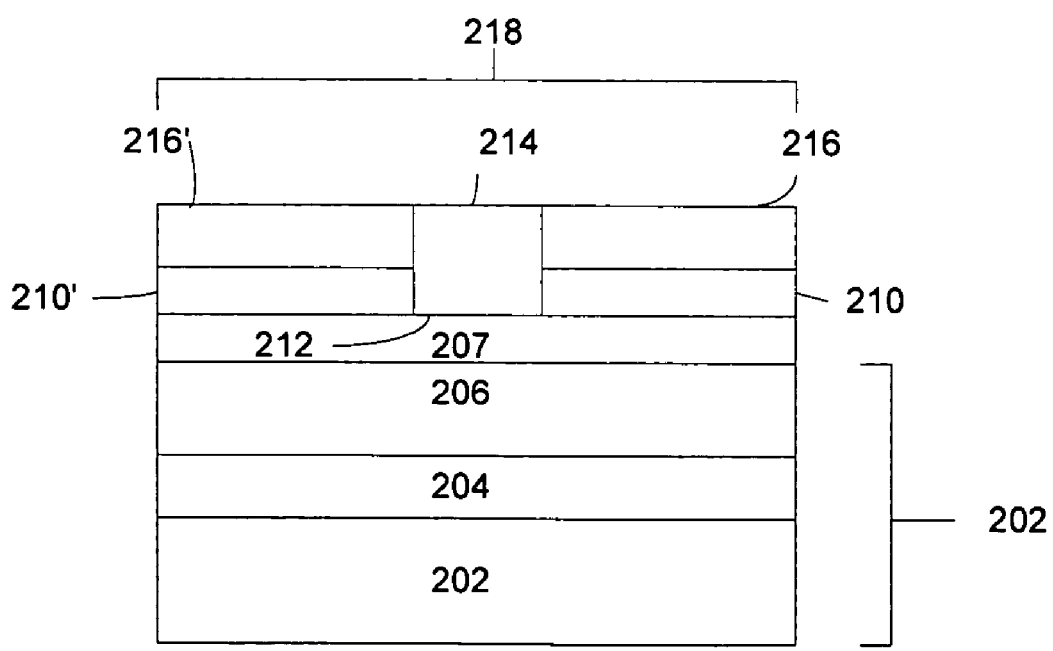

A dielectric layer 208 may be formed on the buffer layer 207 (FIG. 2c). The dielectric layer 208 may then be patterned to form a buffer region 212 (by exposing the underlying buffer layer 207) and at least one dielectric region (shown in FIG. 2d as a first dielectric region 210 and a second dielectric region 210'). A composite silicon germanium layer 218 (similar to the composite silicon germanium layer 118) may then be formed (FIG. 2e) on the buffer region 212 and the dielectric region 210, 210' by selective epitaxy, as previously described. The composite silicon germanium layer 218 comprises at least 50 percent germanium. The composite silicon germanium alloy 218 forms vertically over the buffer region 212, and also forms laterally over the dielectric region 210, 210'. The composite silicon germanium layer 218 further comprises a high defect silicon germanium layer 214 (similar to high defect region 114) and at least one low defect silicon germanium layer (shown in FIG. 2e as a first low defect silicon germanium layer 216 and a second low defect silicon germanium layer 216', similar to low defect region 116, 116'). The high defect silicon germanium layer 214 that forms over the buffer region 212 may comprises a defect density in the range of about $5 \times 10^6$ defects per centimeter squared or lower, but the defect density of the high defect silicon germanium layer 214 is less than if the high defect silicon germanium layer 214 were grown directly on a silicon substrate, as in high defect layer 114. The defects formed during the formation of the composite silicon germanium layer 218 are substantially confined to the high defect silicon germanium layer 214.

The low defect silicon germanium layer 216, 216' forms over the dielectric region 210, 210' by epitaxial lateral overgrowth. The defect density in the low defect silicon germanium layer 216, 216' is below $10^6$ defects per centimeter squared, and may be virtually defect free, because the defects in the composite silicon germanium layer 218 are substantially confined to the high defect silicon germanium layer 214. Thus, the method of the present invention provides a high germanium concentration, low defect silicon germanium layer 216, 216' which incorporates a buffer layer 207 which reduces the defect density of the high defect silicon germanium layer 214.

Figure 5A:
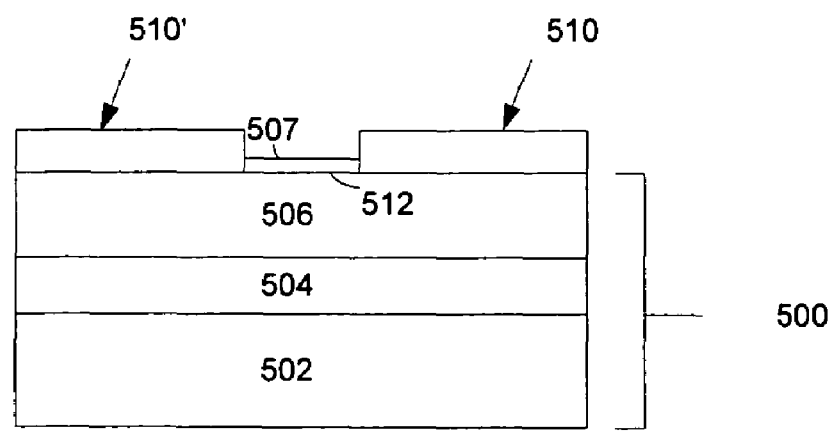
FIGS. 5a–5b represent cross-sections of structures that may be formed when carrying out another embodiment of the method of the present invention.
Figure 5B:
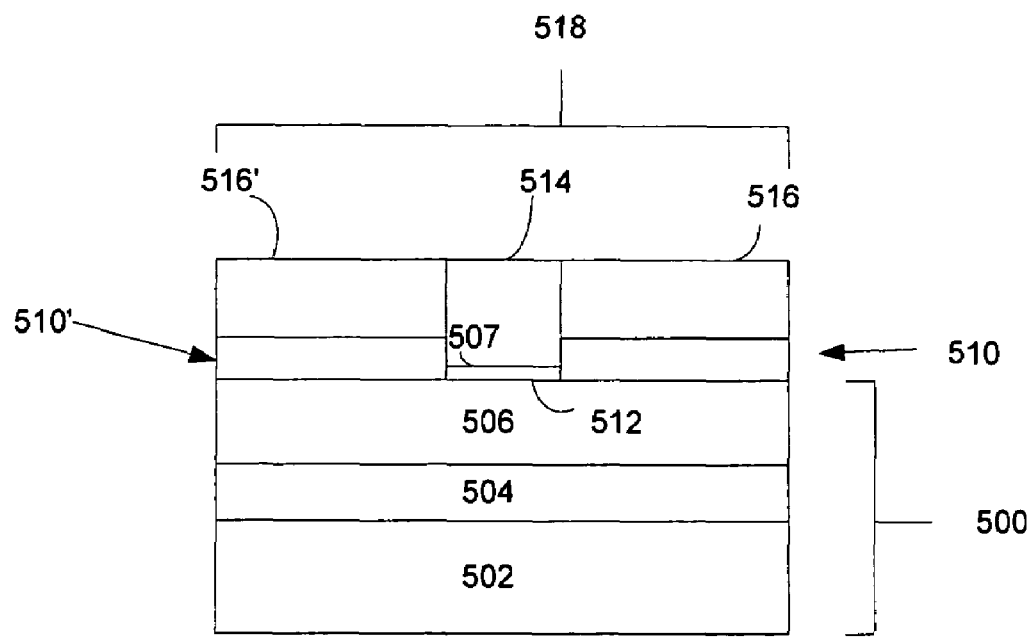

In another embodiment (FIG. 5a), a thin buffer buffer layer 507 (similar to buffer layer 207) may be selectively formed over a silicon region 512 (similar to the silicon region 112). The silicon region 512 and a dielectric region 510, 510' (similar to dielectric region 210', 210'), are disposed on a substrate 500 (FIG. 5a). The thin buffer layer 507 is preferably less than 1 micron in thickness. A composite silicon germanium layer 518 (similar to the composite silicon germanium layer 218) may then be formed over the silicon region 512 and the dielectric region 510, 510' (FIG. 5b). The composite silicon germanium layer 518 may comprises a high defect silicon germanium layer 514 (similar to the high defect silicon germanium, layer 214) and a low defect silicon germanium layer 516, 516' (similar to the low defect silicon germanium layer 216, 216'). Thus, the current embodiment provides a high germanium concentration, low defect silicon germanium layer 516, 516' which incorporates a thin buffer layer 507 which is selectively grown over the silicon region 512.

Figure 3A:
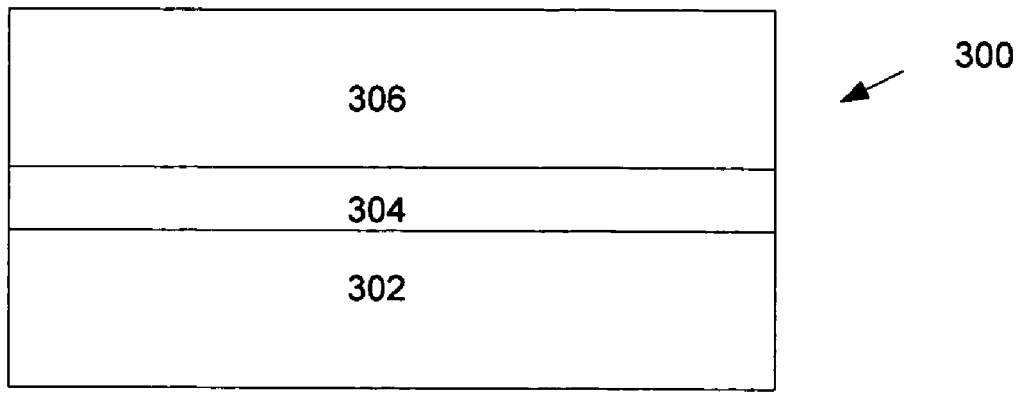
FIGS. 3a–3i represent cross-sections of structures that may be formed when carrying out another embodiment of the method of the present invention.
Figure 3B:
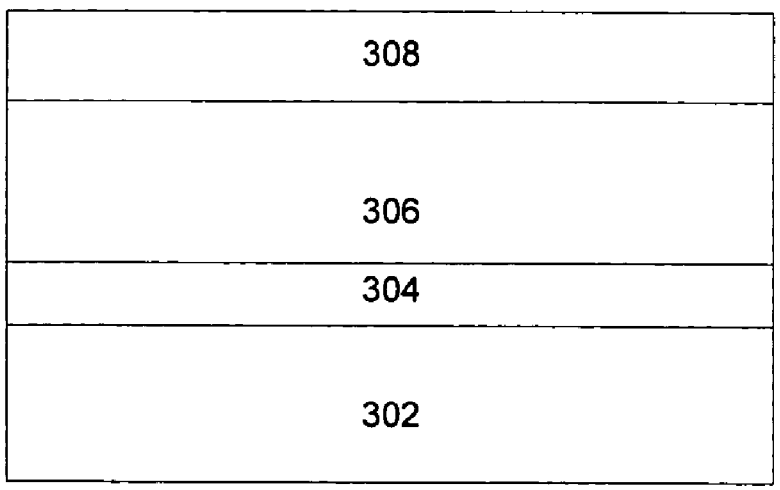
Figure 3C:
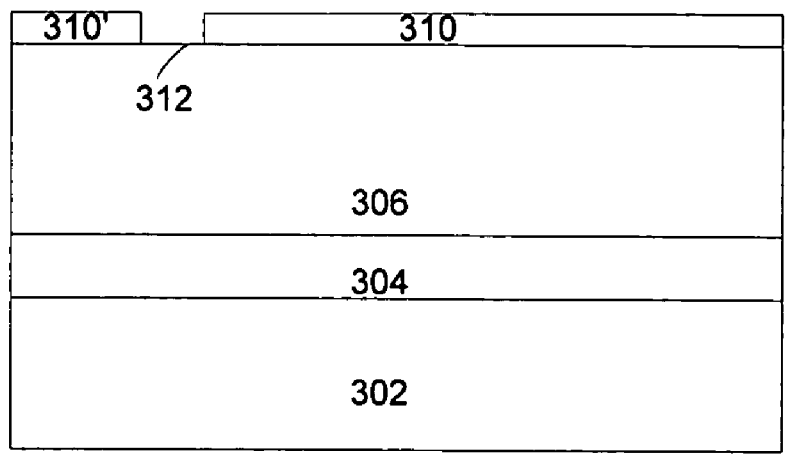
Figure 3D:
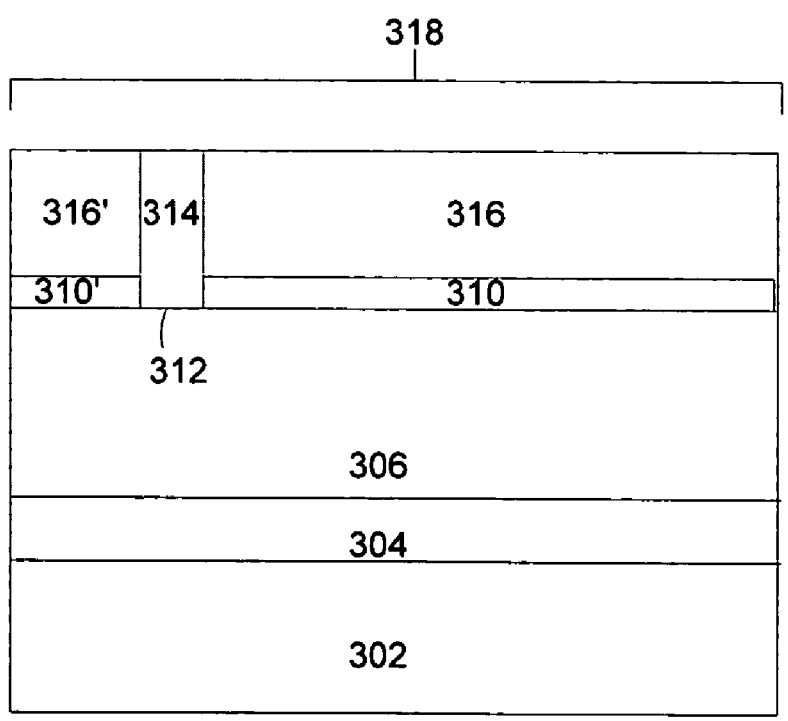

In another embodiment of the present invention, a method of forming a microelectronic device, such as a light-sensing device 334 (FIG. 3i) and structures formed thereby is illustrated in FIGS. 3a–3i. A substrate 300, which may be a SOI substrate (similar to the SOI substrate 100 in FIG. 1a), comprises first silicon layer 302, an insulator layer 304 disposed on the first silicon layer 302, and a second silicon layer 306 disposed on the insulator layer 304 (FIG. 3a). The insulator layer 304 may be an oxide, such as silicon dioxide. It will be understood by those skilled in the art that the substrate 300 may include various structures, such as a trench structure, as is well known in the art.

A dielectric layer 308 may then be formed on the second silicon layer 306 of the silicon substrate 300 (FIG. 3b) using conventional methods known in the art, such as CVD. The dielectric layer 308 may then be patterned to form a silicon region 312 and at least one dielectric region (shown in FIG. 3c as a first dielectric region 310, and a second dielectric region 310').

A composite silicon germanium layer 318 (similar to the composite silicon germanium layer 218) may then be formed (FIG. 3d) by selective epitaxy, as previously described, wherein the composite silicon germanium layer 318 comprises at least 50 percent germanium. The composite silicon germanium layer 318 forms vertically over the silicon region 312 and also forms laterally over the dielectric region 310, 310'. The composite silicon germanium layer 318 further comprises a high defect silicon germanium layer 314 and a low defect silicon germanium layer (shown in FIG. 3d as a first low defect silicon germanium layer 316, and a second low defect silicon germanium layer 316'). The high defect silicon germanium layer 314 that forms over the silicon region 312 comprises a defect density in the range of about $5 \times 10^6$ defects per centimeter squared. The defects formed during the formation of the composite silicon germanium layer 318 are substantially confined to the high defect silicon germanium layer 314.

The low defect silicon germanium layer 316, 316 forms over the dielectric region 310, 310' by epitaxial lateral overgrowth. The defect density in the low defect silicon germanium layer 316, 316' is below $10^6$ defects per centimeter squared, and may be virtually defect free, because the defects in the composite silicon germanium layer 318 are substantially confined to the high defect silicon germanium layer 314.

Figure 3E:
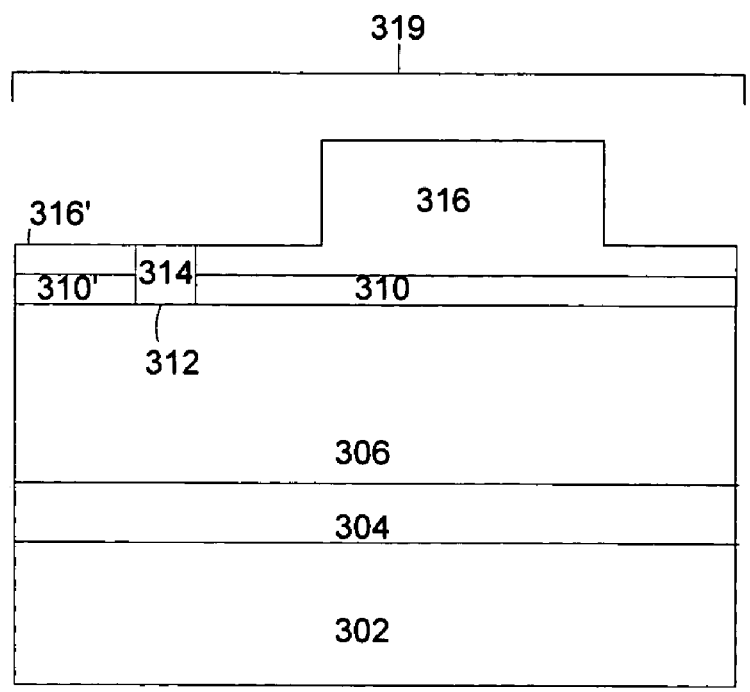

The composite silicon germanium layer 318 may be patterned by methods known in the art to form a patterned composite silicon germanium structure 319 (FIG. 3e). Such structures may include a waveguide, or other such optical devices used in optical communication systems, for example. The patterned composite silicon germanium structure 319 may be further processed to form a p-i-n photodiode 320 (for ease of understanding, shown separated from the patterned composite silicon germanium structure 319 in FIG. 3f). The p-i-n photodiode 320 may comprise at least one p-type low defect silicon germanium layer (shown in FIG. 3f as a first p-type low defect silicon germanium layer 321 and a second p-type low defect silicon germanium layer 321'), an intrinsic low defect silicon germanium layer 322, and an n-type low defect silicon germanium layer 323.

Figure 3F:
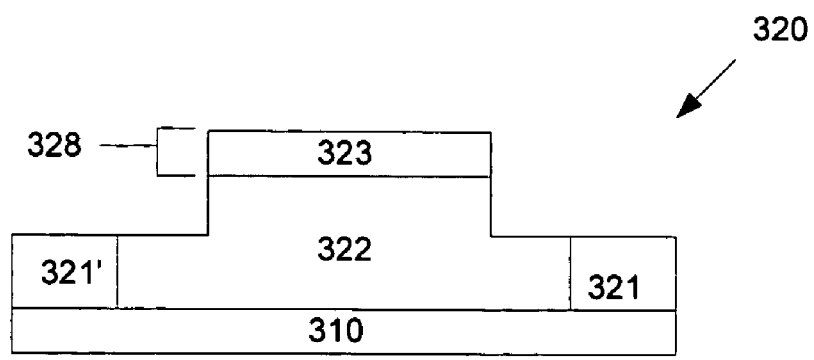
Figure 3G:
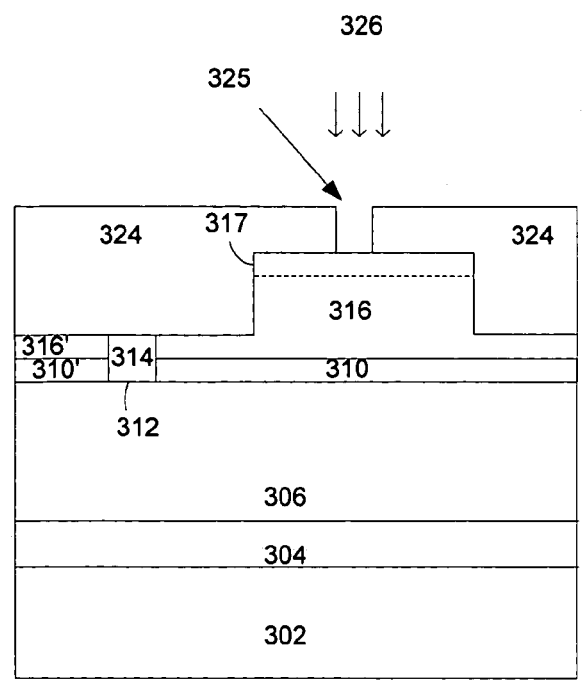

The p-i-n photodiode 320 may be formed from the patterned composite silicon germanium structure 319 by first forming a mask 324, as is well known in the art, on the patterned composite silicon germanium layer 319 (FIG. 3g). The mask 324 may comprise at least one implantation opening 325 to the low defect silicon germanium layer 316. An ion implantation 326, as is well known in the art, may be performed in which an n-type dopant (impurity) is implanted into an upper region 317 of the first low defect silicon germanium layer 316. The n type dopant may include such dopants as phosphorus, arsenic, or other such n-type dopant materials as are well known in the art. In this manner, the upper region 317 of the first low defect silicon germanium layer 316, which normally comprises an intrinsic level doping (i.e., there is no excess of either a p type or n-type dopant material) is doped with n-type dopant to form the n type low defect silicon germanium layer 323 of the p-i-n diode 320 (see FIG. 3h). The depth 328 of the upper region 317 (as shown in FIG. 3f) may be adjusted according to the design parameters of the light sensing device 334.

Figure 3H:
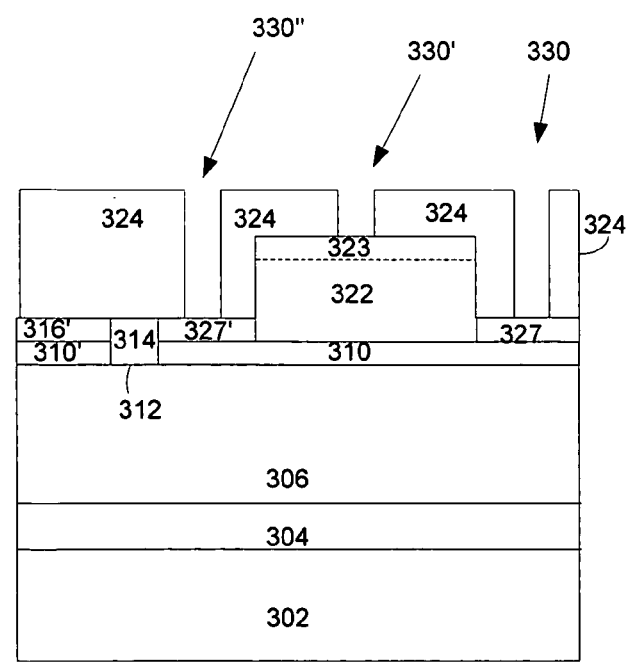
Figure 3I:
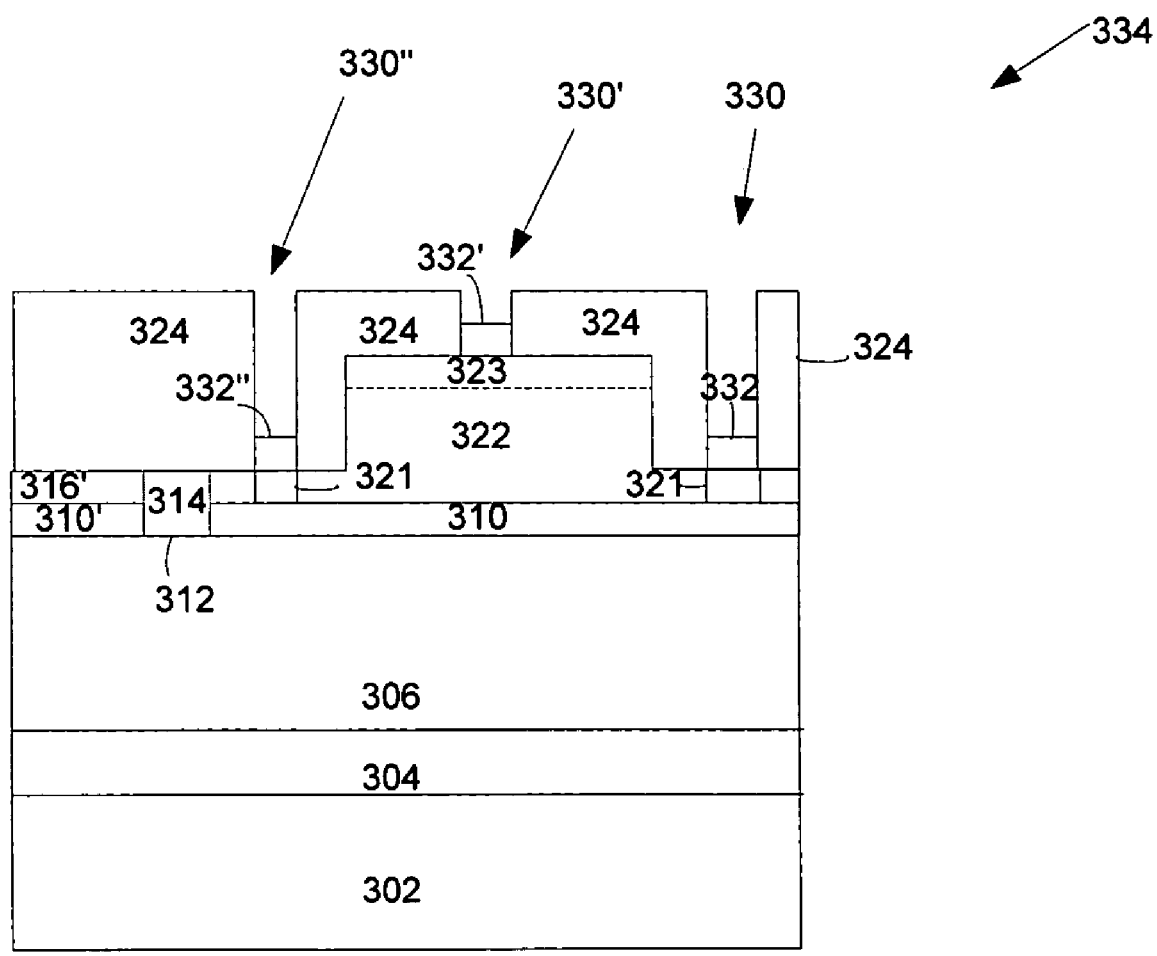

The intrinsic low defect silicon germanium layer 322 of the p-i-n photodiode 320 comprises the region of the first low defect silicon germanium layer 316 beneath the n type low defect silicon germanium layer 323 (which is normally intrinsic, as previously described, see FIG. 3h). The p-type low defect silicon germanium layer 321, 321' is formed by first forming at least one metallization opening (illustrated in FIG. 3h as a first metal mask opening 330, a second metal mask opening 330' and a third metal mask opening 330") in the mask 324. A metal contact (shown in FIG. 3i as a first metal contact 332, a second metal contact 332' and a third metal contact 332") may then be formed on at least one low defect silicon germanium contact region (shown in FIG. 3h as a first low defect silicon germanium contact region 327 and a second low defect silicon germanium contact region 327') in a manner well known in the art. The low defect silicon germanium contact region 327, 327' is a region of the first low defect silicon germanium layer 316 that is not beneath the n type low defect silicon germanium layer 323. The first metal contact 332 and the third metal contact 332'" that form on the first low defect silicon germanium contact region 327 and the second low defect silicon germanium contact region 327' respectively, may dope the low defect silicon germanium contact region 327, 327' with a p-type dopant. For example, where the metal contact 332, 332'" is aluminum, the aluminum metal itself may provide a p-type dopant to the low defect silicon germanium contact region 327, 327', thus forming the p-type low defect silicon germanium layer 321, 321' of the p-i-n diode 320 (FIG. 3i). The second metal contact 332' may also form on the n type low defect silicon germanium layer 323 during the same process step which forms the first metal contact 332 and the third metal contact 332". Metallization to the photodiode 320 is thus enabled and in this manner the light sensing device 334, which form a portion of an optical device, such as a waveguide, as is well known in the art may be formed.

It will be appreciated by those skilled in the art that the doping of the p-i-n photodiode 320 of the light sensing device 334 may be performed by using other techniques known in the art with which to dope the n and p type layers of such photodiodes, such as the n type low defect silicon germanium layer 323 and the p type low defect silicon germanium layer 321, 321'. Such techniques may include (by example and not limitation) using a CVD deposition, or other non-implant techniques of doping a silicon germanium film as are known in the art. Furthermore, the light sensing device 334 may include other types of photodiodes, such as a metal semiconductor metal (MSM) diode, as is well known in the art (and thus will not be described further herein), and is not limited to a p-i-n photodiode.

Figure 4:
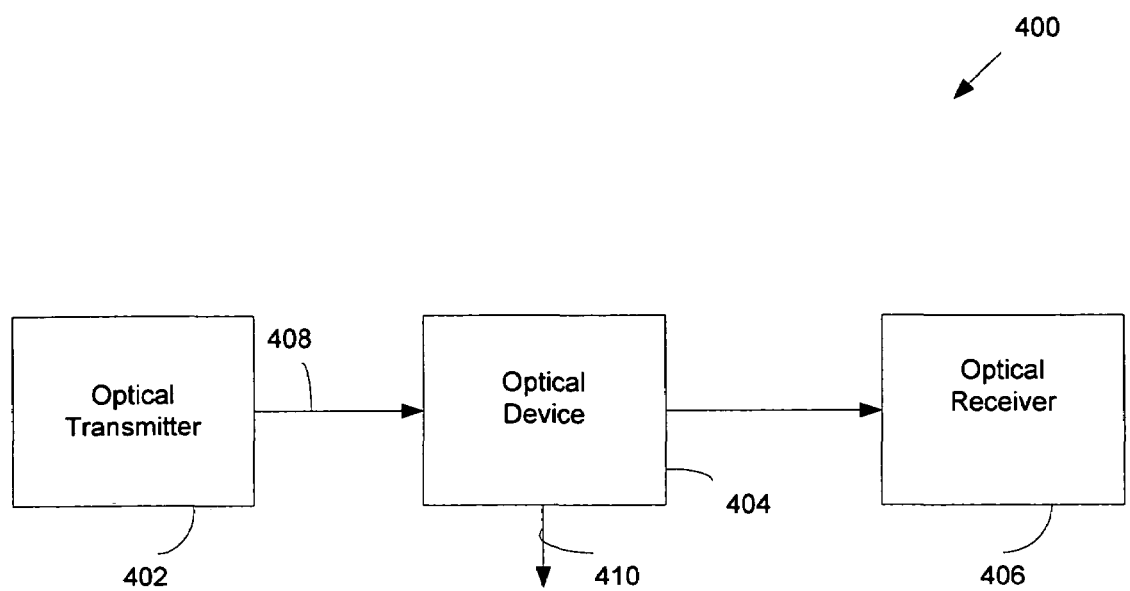
FIG. 4 represents an embodiment of an optical system in accordance with the methods of the present invention.

The light sensing device 334 formed according to the method of the current embodiment may be used in any number of optical communication systems. For example, it is capable of being used in the telecommunications industry, since it is capable of operating above 1.3 microns, which is the telecommunications industry standard operating wavelength. FIG. 4 is a diagram illustrating one embodiment of an optical communication system 400 including an optical device 404, such as the light sensing device 334 of the present invention. In various embodiments the optical device 404 may include a light sensing device, such as a waveguide. In the depicted embodiment, the optical communication system 400 includes an optical transmitter 402 to transmit an optical beam 408. An optical receiver 406 is optically coupled to receive the optical beam 408. It is appreciated that the optical transmitter 402 and the optical receiver 406 may also include optical transceivers and therefore have both transmitting and receiving capabilities for bidirectional communications. In one embodiment, the optical device 404 is optically coupled between optical transmitter 402 and optical receiver 406. In the illustrated embodiment, optical device 404 is shown to be at the receiving end of optical communication system 400. In other embodiments, the optical device 404 may be disposed at various locations along a transmission path or at the transmitting end of the optical communication system 400. In one embodiment, the optical device 404 may be included in a waveguide and be utilized in for example an add/drop filter, as is well known in the art, that enables the addition or extraction of a channel from a wave division multiplexed (WDM, also well known in the art) optical beam 408 transmitted from optical transmitter 402 along an optical path. Thus, an optical beam 410 having a specific wavelength is output from the optical device 404.

As described above, the present invention provides methods and associated structures of forming a high germanium concentration, low defect density silicon germanium film in order to enable microelectronic devices which are capable of operating at wavelengths of 1.3 microns and above. In addition, because there are less defects per centimeter squared in the low defect silicon germanium layer of the present invention, the dark current of a device (a measurement of current leakage during non-operating times), may be to about 10 microamperes or below. This greatly enhances the reliability and performance of a device fabricated according to the various embodiments of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture a silicon device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A system, comprising:
an optical transmitter to transmit an optical beam;
an optical receiver optically coupled to the optical transmitter to receive the optical beam; and
an optical device coupled between the optical transmitter and the optical receiver, the optical device including a photodiode comprising a low
defect silicon germanium layer disposed on a portion of a top surface of a dielectric region, wherein the portion is greater than about 50%, and wherein the dielectric layer is disposed on a buffer layer wherein the buffer layer comprises a graded silicon germanium buffer layer.

2. The system of claim 1 wherein the photodiode comprises a p-i-n diode.

3. The system of claim 1 wherein the photodiode comprises a MSM diode.

4. The system of claim 1 wherein the low defect silicon germanium layer comprise less than about $10^6$ defects per $cm^2$.

5. The system of claim 1 wherein the low defect silicon germanium layer comprises at least 50 percent germanium.

6. The system of claim 1 wherein the thickness of the buffer layer is less than about 1 micron.

* * * * *